Nov. 3, 1964 D. B. LEVINSON 3,155,843

BLOCKING OSCILLATOR

Filed May 25, 1961

*INVENTOR.*
DONALD B. LEVINSON

*BY* [signature]

ATTORNEY 3,155,843

BLOCKING OSCILLATOR

Donald B. Levinson, Beverly Hills, Calif., assignor to General Precision, Inc., a corporation of Delaware
Filed May 25, 1961, Ser. No. 112,597
4 Claims. (Cl. 307—88.5)

Figure 1:
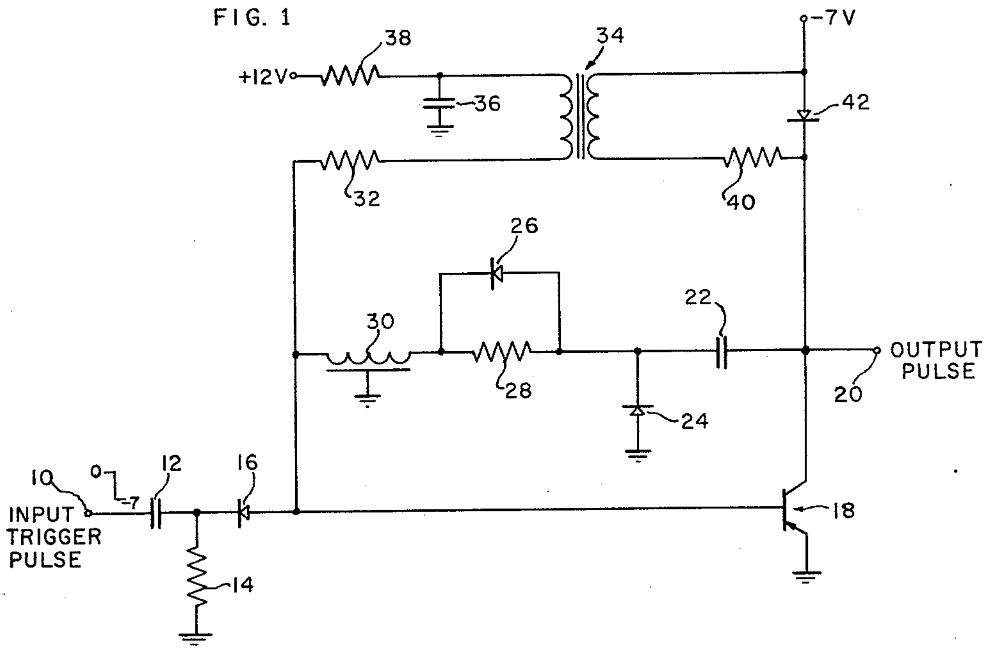

The present invention relates to blocking oscillators, and it relates more particularly to an improved, transistorized, high speed blocking oscillator of the type incorporating a delay line.

The blocking oscillator is a relaxation oscillator which cyclically generates a short-duration pulse. In the usual blocking oscillator, the input and output circuits are coupled together through a transformer in a regenerative feedback arrangement. The output signal is periodically interrupted and the discharge device in the blocking oscillator is periodically blocked by virtue of the regenerative action which causes the discharge device to be biased into its non-conductive region.

The duration of the period between successive output pulses coincides with the period during which the discharge device is blocked, and this period depends upon the resistance-capacitance time constant in the input circuit. The usual blocking oscillator may be either a free running type, or one which requires a trigger pulse to initiate each operational cycle.

The present invention is concerned with the latter type of blocking oscillator, and one which includes a delay line as a control element and a transistor as a saturated type of switching device.

In the blocking oscillator of the invention, and as mentioned above, initiation of the blocking oscillator cycle is by a trigger pulse. This trigger pulse causes the transistor in the blocking oscillator to regenerate a feedback signal through a blocking oscillator transformer included in the circuit. The delay line included in the blocking oscillator of the invention determines the actual period of the blocking oscillator.

An object of the invention is to provide an improved transistorized blocking oscillator of the delay line controlled monostable type which is capable of extremely high speed operation.

Another object of the invention is to provide such an improved blocking oscillator which is readily adaptable to a wide variety of applications and uses, and which is capable of being constructed to utilize a wide variety of types of transistors and transformers.

A feature of the invention is to provision of a blocking oscillator circuit capable of being conveniently triggered at the base or collector of the transistor incorporated into the circuit, so that the blocking oscillator of the invention rapidly adapts itself for use in different types of systems.

Another feature of the invention is the provision of an improved delay line type of blocking oscillator which is conceived and constructed so that loading of the blocking oscillator does not produce distortion in the output signal, as is the case in most prior blocking oscillators of this type, this being due to impedance mismatch in the delay lines of the prior art blocking oscillators.

Another feature of the invention is the provision of an improved transistorized blocking oscillator which functions as a saturated gate and which therefore has the capability of directly driving other gates.

Yet another feature of the invention is the provision of an improved transistorized blocking oscillator which, because of its delay line control, is capable of generating an output pulse whose characteristics are independent of excitation potentials and of load.

A still further feature of the invention is to provide such an improved blocking oscillator which is capable of developing output pulses of sufficient power to drive normal loads without the need for a buffer amplifier, or the like.

Figure 2:
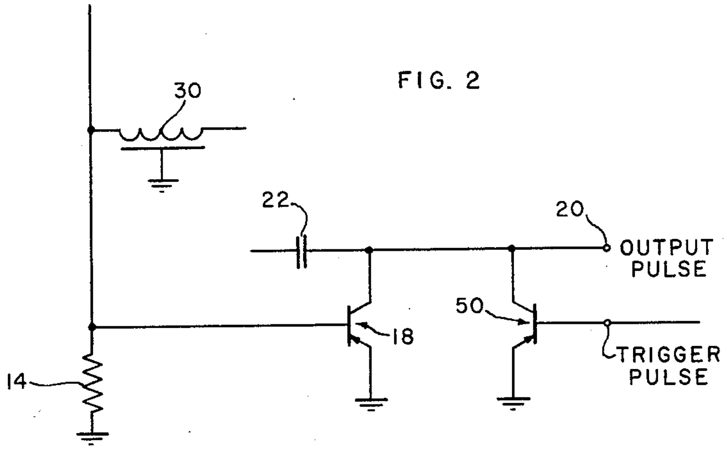

The above and other features of the invention which are believed to be new are set forth in the claims. The invention itself, however, together with further objects and advantages thereof, may best be understood by reference to the following description when taken in conjunction with the accompanying drawing, in which:

FIGURE 1 is a circuit diagram of a blocking oscillator constructed in accordance with one embodiment of the invention, and which is susceptible to base triggering of the transistor incorporated in the blocking oscillator circuit; and FIGURE 2 is a fragmentary diagram of a modification to the blocking oscillator of FIGURE 1 to render the blocking oscillator susceptible to collector triggering of the transistor included therein by trigger pulses of opposite polarity to the trigger pulses in the embodiment of FIGURE 1.

The blocking oscillator circuit illustrated in FIGURE 1 includes an input terminal 10. The illustrated blocking oscillator is of the triggered type, that is, it is not free running, and each cycle must be initiated by a trigger pulse introduced to the input terminal 10. This trigger pulse in the illustrated embodiment is a negative-going 7-volt pulse.

The input terminal 10 is connected to a capacitor 12 which may, for example, have a capacity of 540 micromicrofarads. The capacitor 12 is connected to a grounded resistor 14 which may, for example, have a resistance of 1 kilo-ohm; and the capacitor is also connected to the cathode of a diode 16. The capacitor 12 and resistor 14 form a differentiating network for the input trigger pulse.

The anode of the diode 16 is connected to the base of a PNP transistor 18. The emitter of the transistor 18 is grounded, and the collector is connected to an output terminal 20 at which the output pulse is formed.

The collector of the transistor 18 is also connected to a capacitor 22 which may, for example, have a capacity of .005 microfarad. The capacitor 22 is connected to the cathode of a diode 24, to the anode of a diode 26, and to a resistor 28. The anode of the diode 24 is grounded. The resistor 28 may, for example, have a resistance of 500 ohms.

The cathode of the diode 26 and the resistor 28 are connected to the input terminal of a delay line 30. The output terminal of the delay line is connected back to the base of the transistor 18 and to a resistor 32. The resistor 32 may, for example, have a resistance of 200 ohms, and it is connected to one terminal of the secondary of a transformer 34.

The transformer 34 may have a turns ratio of 2:1. The other terminal of the secondary is connected to a grounded capacitor 36 and to a resistor 38. The capacitor 36 may have a capacity of .75 microfarad, and the resistor 38 may have a resistance of 27 kilo-ohms. The other terminal of the resistance 38 is connected to the positive terminal of the 12 volt direct voltage source.

The primary of the transformer 34 is connected to a resistor 40 and to the negative terminal of a 7-volt direct current source. The resistor 40 may have a resistance of 30 ohms. The other terminal of the resistor 40 is connected to the cathode of a diode 42 and to the collector of the transistor 18. The anode of the diode 42 is connected to the negative terminal of the 7-volt direct voltage source.

The differentiating network formed by the capacitor 12 and resistor 14 serves to differentiate the input trigger pulse applied to the input terminal 10. This differentiation causes negative and positive spikes to be applied to the cathode of the diode 16. The diode 16 blocks the positive spike, so that only the negative spike reaches the base of the transistor 18.

The transistor 18 is normally non-conductive. The negative spike introduced to the base of the transistor 18, when an input trigger pulse is applied to the input terminal 10, triggers the transistor circuit and causes the transistor to become conductive, and quickly reach a saturated state. When the transistor 18 is rendered conductive, a current builds up in the primary of the transformer 34 and this current causes a voltage to be induced across the secondary of such a polarity as to hold the transistor 18 in its fully conductive, saturated condition.

At the instant the transistor 18 is rendered conductive by the negative spike from the differentiating network 12–14, the polarity of its collector swings in the positive direction toward ground potential. This introduces a positive pulse into the delay line 30. The positive pulse travels through the capacitor 22, through the diode 26 and through the delay line 30 to the base of the transistor 18. As soon as the pulse from the delay line 30 reaches the base of the transistor 18, the transistor is immediately rendered non-conductive.

The capacitor 22 serves as a direct current isolating element between the collector and base of the transistor 18. The resistor 28 serves to terminate the delay line 30 in its characteristic impedance for the first reflected pulse in the delay line. The diode 26 serves to by-pass the resistance 28 for the positive pulse from the collector of the transistor 18.

The diode 24 serves to prevent re-triggering of the blocking oscillator circuit due to the rapidity of its operation. At the completion of the blocking oscillator cycle, the transistor 18 is rendered non-conductive by the pulse from the delay line 30, as described above. This causes the potential of the collector to swing negatively. Without the diode 24, it is possible for the resulting negative pulse to pass through the network 22, 28 and through the delay line 30 to re-trigger the blocking oscillator. However, the diode 24 serves to by-pass such negative pulses to ground and obviates any tendency for such pulses to re-trigger the blocking oscillator circuit.

The resistor 40 is a current limiting resistor, and it serves to protect the transistor 18 and the transformer 34 from damage due to excessive current surges. The resistor 38, the resistor 32, the diode 16 and the resistor 14 form a voltage divider, and this voltage divider introduces a biasing potential to the base of the transistor 18 of a value to hold the transistor non-conductive between successive trigger pulses.

The capacitor 36 establishes one side of the secondary of the transformer 34 at ground potential for alternating currents, as is desired. The value of the resistor 32 is selected so that the base current in the transistor 18 will have a proper value to hold the transistor in its fully conductive, saturated condition during the regenerative portion of the blocking oscillator cycle.

The fragmentary circuit of FIGURE 2 shows a modification of the circuit of FIGURE 1 where it is desired to use positive-going trigger pulses and collector triggering. In the latter embodiment, the capacitor 12 of the circuit of FIGURE 1 is dispensed with, and the diode 16 is shorted out. A second transistor 50 has its collector connected to the collector of the transistor 18, and has its emitter grounded. The positive-going trigger pulse in the embodiment of FIGURE 2 is applied to the base of the transistor 50. The resulting positive-going current pulse at the collector of the transistor 50 causes the transistor 18 to be rendered conductive, so as to institute a blocking oscillator cycle, similar to the cycle described above.

The invention provides, therefore, an extremely fast acting transistorized blocking oscillator which is capable of producing output pulses having width of from 0.05 to 1.0 microsecond, for example, by the appropriate selection of the delay line.

The improved blocking oscillator of the invention, as noted above, is advantageous in that it is susceptible to base or collector triggering, whichever is most convenient in any particular application.

As also noted, the blocking oscillator of the invention is advantageous in that loading does not cause distortion in the output pulses, because such loading in the blocking oscillator of the invention does not result in delay line mismatch and in resulting reflections in the delay line.

The improved blocking oscillator of the invention also exhibits further advantages discussed above. In general, the invention provides a simple and improved blocking oscillator which is capable of rapid action and which is adaptable to a wide variety of component types and to a wide variety of applications.

I claim:

1. A blocking oscillator including: a transistor having an emitter electrode, a collector electrode and a base electrode, said base electrode being connected to a point of reference potential; a transformer having a primary winding and a secondary winding; first circuit means including said primary winding for connecting said collector electrode to a first unidirectional potential source of a first polarity with respect to said point of reference potential; second circuit means including said secondary winding and further including voltage-divider resistance means connected across a second unidirectional potential source of a second polarity with respect to said point of reference potential and further connected to said base electrode to render said transistor normally non-conductive and to provide regenerative feedback action in said oscillator so as to cause said transistor to be driven to a fully conductive saturated condition upon its being triggered to its conductive condition; third circuit means including a delay line coupled between said collector electrode and said base electrode and responsive to an output signal from said transistor upon said transistor being driven to its fully conductive saturated condition to introduce a signal to said base electrode after a predetermined time delay established by said delay line so as to return the transistor to its non-conductive condition; said third circuit means further including resistance means in series with said collector and said delay line having a selected resistance value for terminating the input of said delay line in the characteristic impedance thereof so as to attenuate signals reflected therein, a first diode connected across said series resistance means for providing a low impedance path to said delay line for said output signal from said transistor, and a second diode connected from the junction of said collector and said series resistance means to said point of reference potential for providing a low impedance path to said point of reference potential for signals of opposite polarity to said output signal.

2. A blocking oscillator including: a PNP transistor including an emitter electrode, a collector electrode and a base electrode, said base electrode being connected to a point of reference potential; a transformer having a primary winding and a secondary winding; first circuit means including said primary winding for connecting said collector electrode to a negative unidirectional potential source; second circuit means including said secondary winding and further including voltage-divider resistance means connected across a positive potential source and further connected to said base electrode to render said transistor normally non-conductive and to provide a regenerative feedback action in said oscillator to cause said transistor to be driven to a fully conductive saturated condition upon its being triggered to a conductive condition; third circuit means including a delay line coupled between said collector electrode and said base electrode and responsive to a positive-going output signal from said transistor upon said transistor being driven to its fully conductive saturated condition to introduce a positive-going signal to said base electrode after a predetermined time delay established by said delay line so as to return said transistor to its non-conductive condition; said third circuit means including resistance means in series with said collector and said delay line having a selected resistance value for terminating the input of said delay line in the characteristic impedance thereof so as to attenuate signals reflected thereby, a first diode connected across said series resistance means for providing a low impedance path to said delay line for said positive-going output signal from said transistor, and a second diode connected from the junction of said collector and said series resistance means to said point of reference potential for providing a low impedance path to said point of reference potential for negative-going signals.

3. The blocking oscillator defined in claim 1 and which includes input circuit means coupled to said base electrode for introducing triggering pulses to the blocking oscillator.

4. The blocking oscillator defined in claim 1 and which includes input circuit means coupled to said collector electrode for introducing triggering pulses to said blocking oscillator.

References Cited in the file of this patent

UNITED STATES PATENTS

| | | |
|---|---|---|
| 2,848,613 | Green et al. | Aug. 19, 1958 |
| 2,886,706 | Rogers | May 12, 1959 |
| 2,950,398 | Johnson | Aug. 23, 1960 |